United States Patent [19]

Asai et al.

[11] Patent Number: 4,567,393

[45] Date of Patent: Jan. 28, 1986

[54] SURFACE ACOUSTIC WAVE DEVICE HAVING AlN AND ZnO LAYERS ON A Si SUBSTRATE

[75] Inventors: Ryuichi Asai; Takeshi Okamoto; Shoichi Minagawa, all of Tokyo, Japan

[73] Assignee: Clarion Co., Ltd., Tokyo, Japan

[21] Appl. No.: 618,971

[22] Filed: Jun. 11, 1984

[30] Foreign Application Priority Data

Jun. 14, 1983 [JP] Japan .................. 58-107436

[51] Int. Cl.$^4$ .......................... H03H 9/25
[52] U.S. Cl. .................... 310/313 A; 333/154
[58] Field of Search ........... 310/313 B, 313 R, 313 A; 333/154, 195, 151, 155, 194, 196

[56] References Cited

U.S. PATENT DOCUMENTS

| | | | |
|---|---|---|---|
| 4,006,438 | 2/1977 | Bennett | 310/313 C |
| 4,037,176 | 7/1977 | Ono et al. | 310/313 B |
| 4,328,472 | 5/1982 | Grudkowski | 333/141 |
| 4,350,916 | 9/1982 | August et al. | 310/313 B |

OTHER PUBLICATIONS

A. H. Fahmy et al, "Multilayer Acoustic-Surface-Wave Program", Proc. IEEE, vol. 122, No. 5, May 1975, pp. 470–472.

Primary Examiner—Peter S. Wong
Assistant Examiner—D. L. Rebsch
Attorney, Agent, or Firm—Flynn, Thiel, Boutell & Tanis

[57] ABSTRACT

A surface acoustic wave device comprises a silicon substrate, an aluminum nitride layer provided on the silicon substrate, a zinc oxide layer provided on the aluminum nitride layer, and electrodes provided on either the silicon substrate, aluminum nitride layer or zinc oxide layer. Propagation is in the [001]- or [011]-axis direction on (100) Si, [001]- or [1$\bar{1}$0]-axis on (110) Si, [11$\bar{2}$]-axis on (111) Si, or [11$\bar{1}$]-axis on (112) Si.

15 Claims, 15 Drawing Figures

SURFACE ACOUSTIC WAVE DEVICE HAVING AlN AND ZnO LAYERS ON A Si SUBSTRATE

FIELD OF THE INVENTION

This invention relates to a surface acoustic wave device operable with a high efficiency.

BACKGROUND OF THE INVENTION

A number of proposals and attempts are made to develop surface acoustic wave devices as a propagation medium for a surface acoustic wave which travels along the surface of a piezoelectric substrate. This is because the traveling velocity of a surface acoustic wave is only about $10^{-5}$ times that of electromagnetic waves, thus allowing an extreme reduction in size of respective circuit elements and integration of a large number of circuit elements including surface acoustic wave devices on a single substrate. The second reason for such enthusiasm for surface acoustic wave devices is that a signal can be readily picked up from any desired point of the propagation path because a surface acoustic wave travels near the surface of a solid. The third reason is that since the energy is concentrated along the surface of a solid, a surface acoustic wave device may be readily disposed for interaction with light, the carrier in a semiconductor or the like, and may effect a non-linear action due to the highly concentrated energy. The fourth reason is that a surface acoustic wave device may be simultaneously produced on a single substrate together with other circuit elements, thus cooperating with these circuit elements to provide an IC having a unique capablility.

FIGS. 1 and 2 show prior art surface acoustic wave devices. A semiconductor substrate 1 made of silicon or similar material is provided with a piezoelectric layer 2 or 3 made of zinc oxide or of aluminum nitride. Interdigital electrode transducers 4 and 5 are provided on the zinc oxide layer 2 or on the aluminum nitride layer 3. One of the transducers, the transducer 4, for example, is an input electrode, and the other transducer 5 is an output electrode.

A surface acoustic wave, which is excited and converted from an electric signal by the input electrode 4, travels along the surface of the zinc oxide layer 2 or of the aluminum nitride layer 3, and is picked up from the output electrode 5.

Comparing the two devices of FIGS. 1 and 2 with each other by propagating a Rayleigh wave as a surface acoustic wave, the device of FIG. 2 provides a phase velocity 5000 m/s–5500 m/s, whereas the device of FIG. 1 provides 2700 m/s–5100 m/s. This shows that the device of FIG. 2 provides a higher phase velocity and therefore is suitable for use in a high frequency range.

However, the device of FIG. 2 is inferior to that of FIG. 1 in electromechanical coupling coefficient, which is one of the important factors permitting such a surface acoustic wave device to operate with an appreciable efficiency.

OBJECT OF THE INVENTION

It is therefore an object of the present invention to provide a surface acoustic wave device not only suitable for use in a high frequency range but also having an excellent electromechanical coupling coefficient.

SUMMARY OF THE INVENTION

To attain this object, a surface acoustic wave device according to the invention comprises a silicon substrate, an aluminum nitride layer provided on the silicon substrate, a zinc oxide layer provided on the aluminum nitride layer, and electrodes which may be provided on the silicon substrate, on the aluminum nitride layer or on the zinc oxide layer.

The invention will be more clearly understood from the following description made by way of preferred embodiments illustrated in the drawings.

DETAILED DESCRIPTION OF THE PREFERRED EMBODIMENTS

Figure 3:
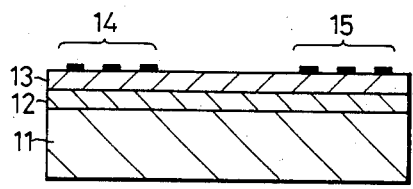
Figure 7:
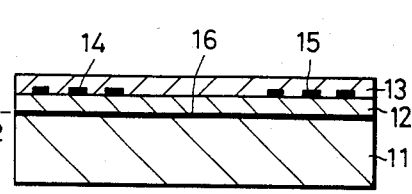
Figure 4:
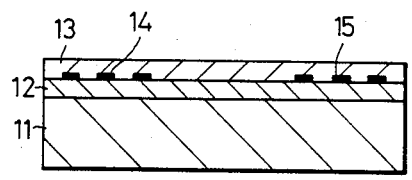
Figure 8:
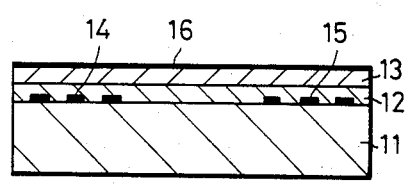
Figure 5:
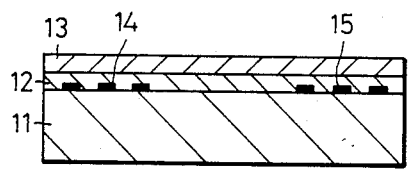
Figure 9:
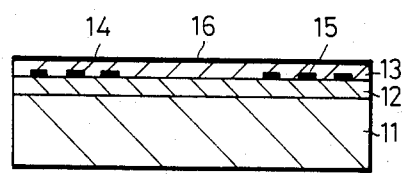
Figure 6:
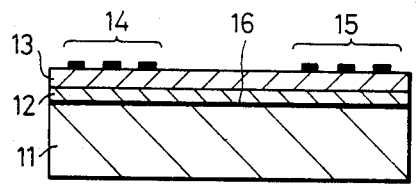
Figure 10:
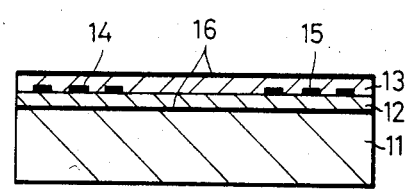

Referring to FIGS. 3 through 5, which are cross-sectional views of surface acoustic wave devices embodying the present invention, respectively, reference numeral 11 denotes a silicon substrate, 12 refers to an aluminum nitride layer provided on the silicon substrate 11 and having a thickness $h_2$, 13 refers to a zinc oxide layer provided on the aluminum nitride layer 12 and having a thickness $h_1$, and 14 and 15 refer to comb-shaped input and output electrodes, respectively.

The input and output electrodes 14 and 15 are provided on the zinc oxide layer 13 in the embodiment of FIG. 3, on the aluminum nitride layer 12 in FIG. 4, and on the silicon substrate 11 in FIG. 5.

FIGS. 6 through 10 are cross-sectional views of further embodiments of the surface acoustic wave device. These embodiments include a conductive layer preferably having a thickness as small as possible and provided on the silicon substrate 11, on the aluminum nitride layer 12, or on the zinc oxide layer 13. The conductive layer 16 or the zinc oxide layer 13 is preferably provided at least just above or just below the interdigitating portion of the comb-shaped electrodes 14 and 15. It will be understood that the conductive layer 16 is provided on the silicon substrate 11 in the embodiments of FIGS. 6 and 7, on the zinc oxide layer 14 in FIGS. 8 and 9, and on both the silicon substrate 11 and the zinc oxide layer 13 in FIG. 10.

The following table shows various combinations of crystalline orientations of the surface of the silicon substrate 11, aluminum nitride layer 12 and zinc oxide layer 13, and traveling axes of a surface acoustic wave.

TABLE

| ZnO layer surface | AlN layer surface | traveling axis | Si substrate surface | traveling axis |
| --- | --- | --- | --- | --- |
| (0001) | (11$\bar{2}$0) | [0001] | (100) | [001] |
| | | | (100) | [011] |
| | | | (110) | [001] |
| | | | (110) | [1$\bar{1}$0] |
| | | | (111) | [11$\bar{2}$] |
| | | | (112) | [11$\bar{1}$] |
| | (1$\bar{1}$00) | [0001] | (100) | [001] |
| | | | (100) | [011] |
| | | | (110) | [001] |
| | | | (110) | [1$\bar{1}$0] |
| | | | (111) | [11$\bar{2}$] |

TABLE-continued

| ZnO layer surface | AlN layer surface | AlN layer traveling axis | Si substrate surface | Si substrate traveling axis |
|---|---|---|---|---|
| | (0001) | | (112) | [111] |
| | | | (100) | [001] |
| | | | (100) | [011] |
| | | | (110) | [001] |
| | | | (110) | [110] |
| | | | (111) | [112] |
| | | | (112) | [111] |

Figure 11:
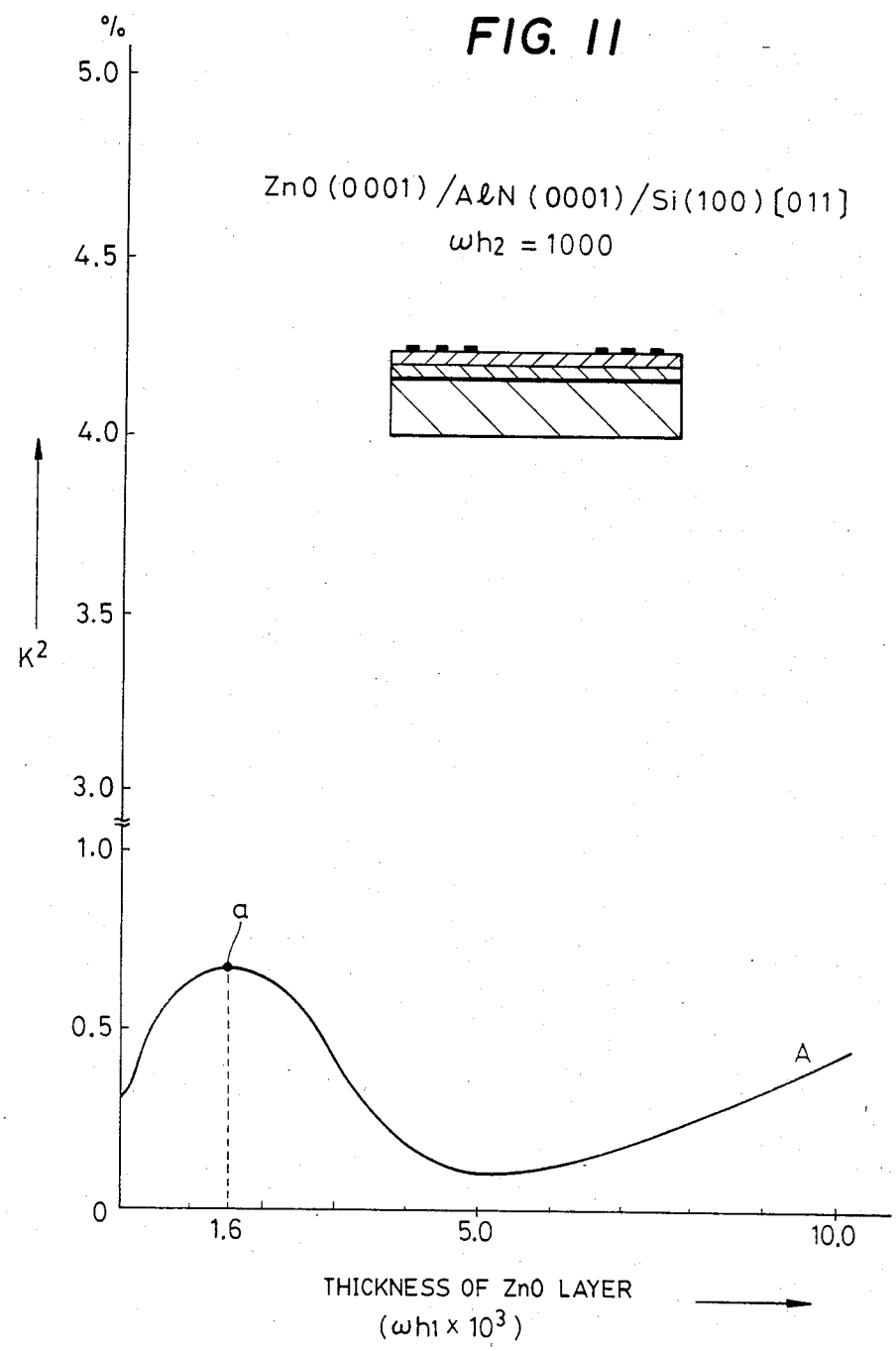
FIGS. 11 to 14 are graphs showing characteristics obtained by the illustrated embodiments.

FIG. 11 shows a characteristic curve A or $K^2$ percentage of the electromechanical coupling coefficient K of the device in the ordinate, with respect to $\omega h_1$ in the abscissa ($\omega$ is the angular frequency of the traveling wave, and $h_1$ is the thickness of the zinc oxide layer 13), when the zinc oxide layer 13 had the (0001)-oriented surface, the aluminum nitride layer 12 has the (0001)-oriented surface, the silicon substrate 11 has the (100)-oriented surface and the [011]-axis, and a Rayleigh wave is used as a surface acoustic wave. This graph shows that the curve A represents the maximum $K^2$ percentage, 0.68% (Rayleigh wave velocity V=4440 m/s) at the point 'a' where $\omega h_1$ and $\omega h_2$ are 1600 and 1000, respectively.

Figure 12:
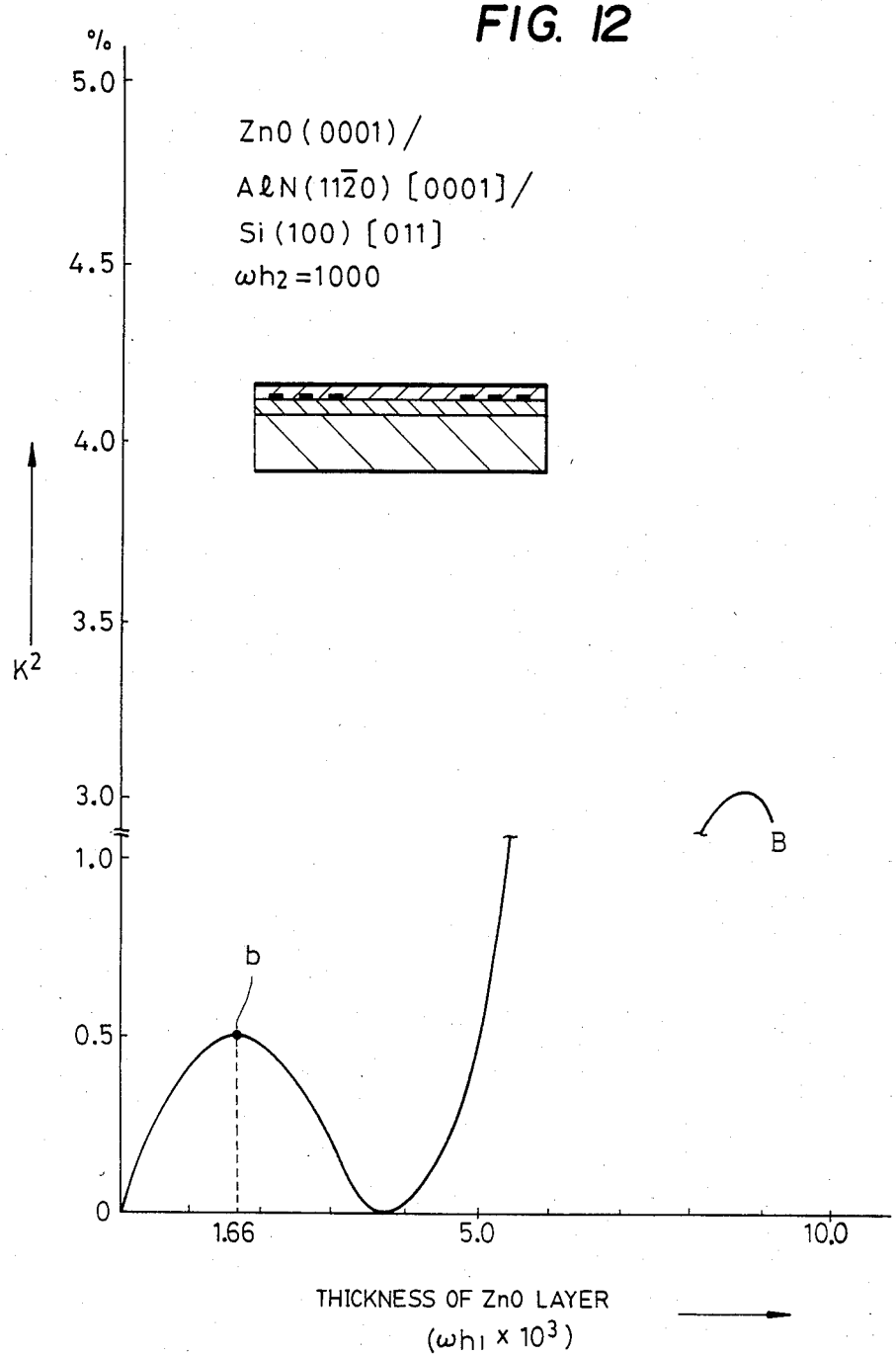

FIG. 12 similarly shows a characteristic curve B of $K^2$ percentage when the zinc oxide layer 13 has the (0001)-oriented surface, the aluminum nitride layer 12 has the (1120)-oriented surface and the [0001]-axis, the silicon substrate 11 has the (100)-oriented surface and the [011]-axis, and a Rayleigh wave is used as a surface acoustic wave. The curve B represents the maximum $K^2$ percentage, 0.54% (Rayleigh wave velocity v=4460 m/s) at the point 'b' where $\omega h_1$ and $\omega h_2$ are 1660 and 1000, respectively.

Figure 13:
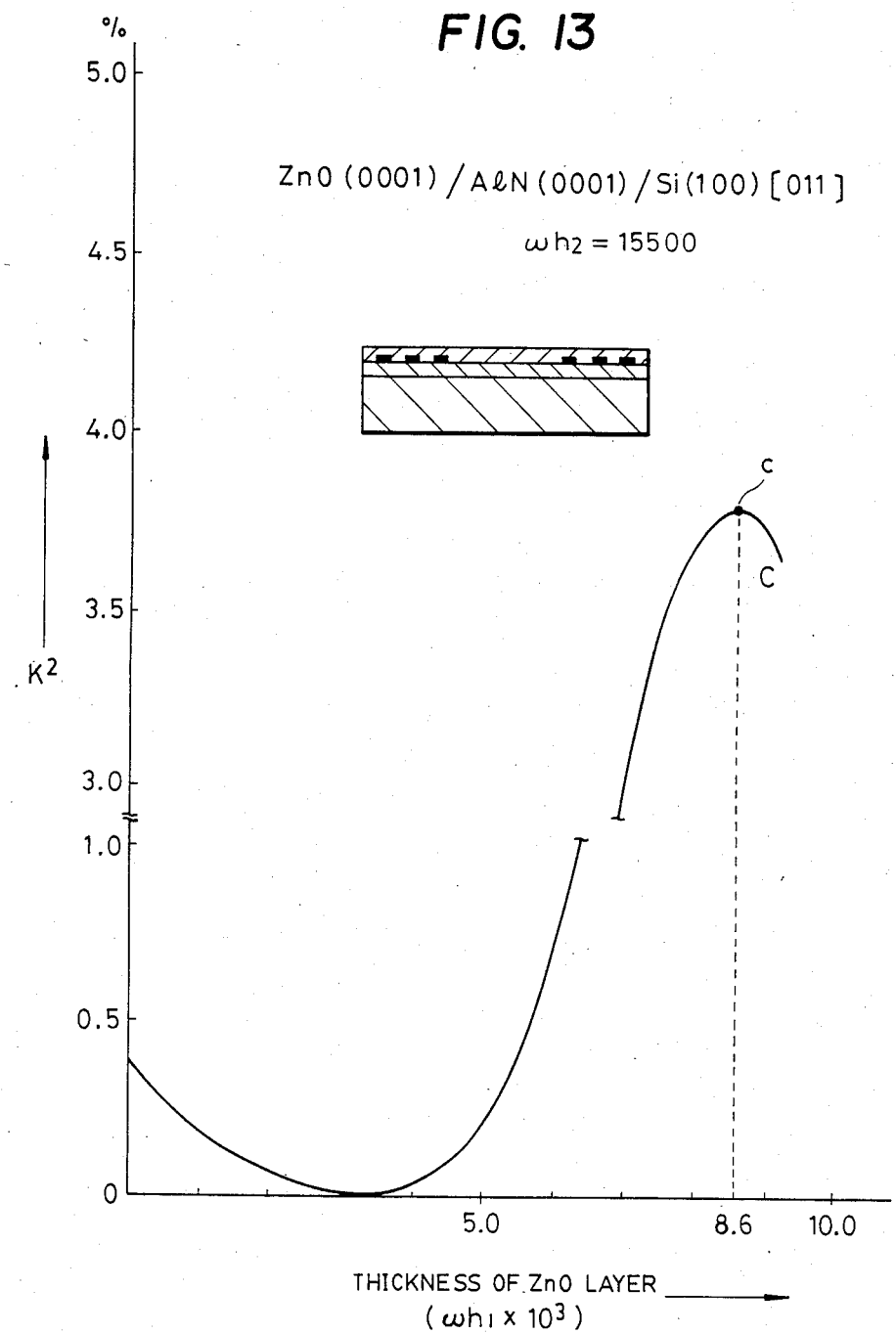

FIG. 13 similarly shows a characteristic curve C of $K^2$ percentage when the zinc oxide layer 13 has the (0001)-oriented surface, the aluminum nitride layer 12 has the (0001)-oriented surface, the silicon substrate 11 has the (100)-oriented surface and the [011]-axis, and a Rayleigh wave is propagated as a surface acoustic wave. The curve C represents the maximum $K^2$ percentage, 3.71% (Rayleigh wave velocity v is 3260 m/s) at the point 'c' where the $\omega h_1$ and $\omega h_2$ are 8600 and 15500, respectively.

Figure 14:
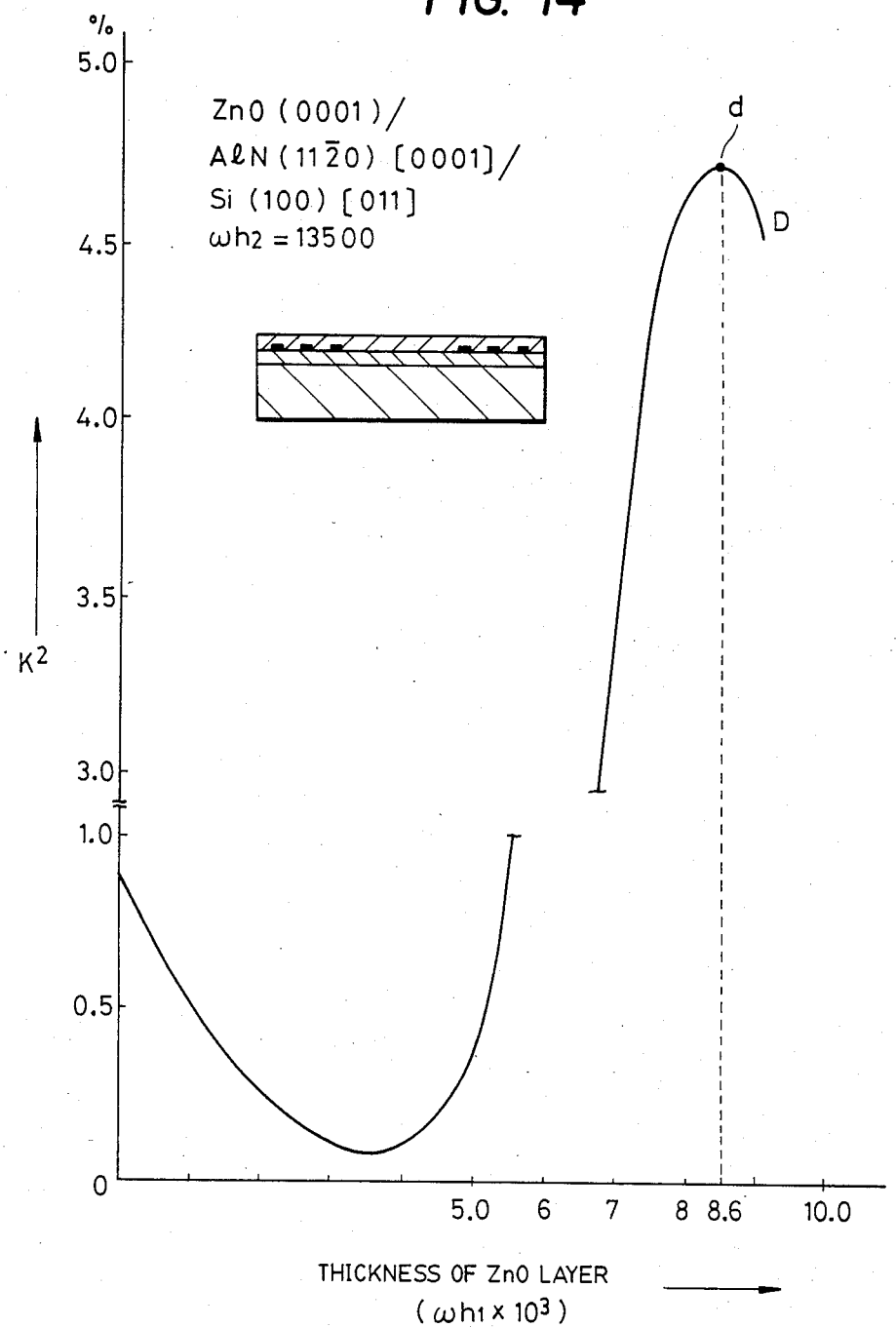

FIG. 14 similarly shows a characteristic curve D of $K^2$ percentage when the zinc oxide layer 13 has the (0001)-oriented surface, the aluminum nitride layer 12 has the (1120)-oriented surface and the [0001]-axis, the silicon substrate 11 has the (100)-oriented surface and the [011]-axis, and a Rayleigh wave is propagated as a surface acoustic wave. The curve D represents the maximum $K^2$ percentage, 4.71% (Rayleigh wave velocity v is 3260 m/s) at the point 'd' where $\omega h_1$ and $\omega h_2$ are 8600 and 13500, respectively.

Figure 1:
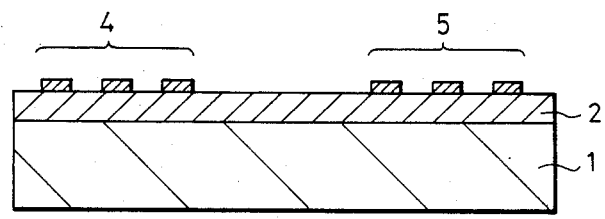
FIGS. 1 and 2 are cross-sectional views of prior art surface acoustic wave devices.
Figure 2:
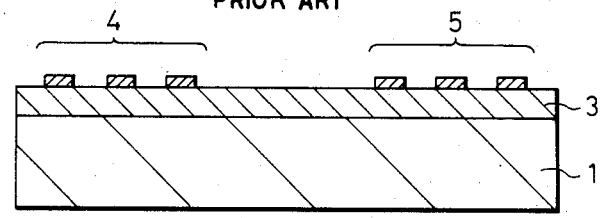

Any one of the above-presented maximum $K^2$ percentages which are obtained by the embodiments of the invention is larger than those obtained of prior art two-layer devices of FIGS. 1 and 2, thus leading to a higher efficiency operation of the surface acoustic wave device.

It has been acknowledged that the other combinations of the crystalline orientations and the wave propagating axes which are listed in the table but are not involved in the combinations of FIGS. 11 through 14 also give similar effects as those described above.

A declination or deviation of each crystalline orientation and wave traveling axis of the silicon substrate 11, aluminum nitride layer 12 and zinc oxide layer 13 within 10 degrees from those shown in the table does not produce a substantial change in the characteristics of the device.

Figure 15:
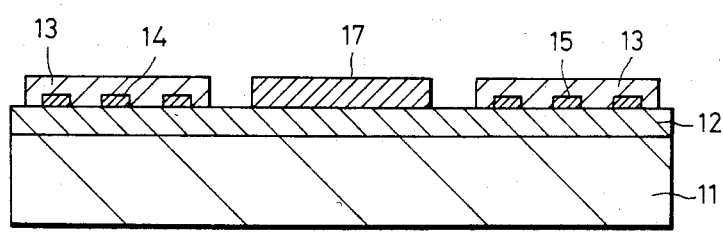
FIGS. 3 to 10 and 15 are cross-sectional views of surface acoustic wave devices embodying the present invention.

FIG. 15 shows a still further embodiment of the invention which is used as a convolver. The zinc oxide layer 13 is selectively provided merely on the input and output electrodes 14 and 15. The device further includes a gate electrode 17 which is not covered by the zinc oxide layer 13. Since the device maintains two-layer structure when the gate electrode 17, namely, merely the aluminum nitride layer 12 and the silicon substrate 11 exist under the gate electrode 17, the surface acoustic wave device (convolver) is provided with excellent $K^2$ characteristics and also maintains its advantage that the group velocity does not differ so much from phase velocity with frequency.

The conductive layer 16 provided on the silicon substrate 11 in the aforedescribed embodiments may be replaced by a high conductive region produced by impurity doping along the surface of the silicon substrate 11.

An electric potential which is generated in the silicon substrate 11, in the aluminum nitride layer 12 or in the zinc oxide layer 13 may take the place of the comb-shaped electrodes.

As described above, the invention employs a silicon substrate with an aluminum nitride layer provided on the silicon substrate and with a zinc oxide layer provided on the aluminum nitride layer, with electrodes provided on one of the silicon substrate, aluminum layer and zinc oxide layer, thereby obtaining a larger electromechanical coupling coefficient which renders the surface acoustic wave device more effective.

Another type of surface acoustic wave, Sezawa wave, for example, may be used instead of Rayleigh wave to give a similar effect. When the silicon substrate of the surface acoustic wave device is replaced by a common substrate which also integrates other IC components thereon, it is possible to provide a compact integrated circuit incorporating a large number of surface acoustic wave devices and other circuit elements.

The embodiments of the invention in which an exclusive property or privilege is claimed are defined as follows:

1. A surface acoustic wave device which comprises:
   a silicon substrate having a major surface;
   an aluminum nitride layer provided on said major surface of said silicon substrate;
   a zinc oxide layer provided on said aluminum nitride layer; and
   electrodes provided on said zinc oxide layer;
   wherein said major surface of said silicon substrate has substantially (100)-, (110)-, (111)- or (112)-crystalline orientation.

2. A surface acoustic wave device which comprises:
   a silicon substrate having a major surface;
   an aluminum nitride layer provided on said major surface of said silicon substrate;
   a zinc oxide layer provided on said aluminum nitride layer; and
   electrodes provided on said silicon substrate;
   wherein said major surface of said silicon substrate has substantially (100)-, (110)-, (111)- or (112)- crystalline orientation.

3. A surface acoustic wave device as claimed in claim 2 wherein a surface acoustic wave is propagated substantially in the [001]- or [011]-axis direction on said (100)-oriented substrate surface, in the [001]- or [110]-axis direction on said (110)-oriented substrate surface, and in the [112]-axis direction on said (111)-oriented substrate surface, in the [111]-axis direction on said (112)-oriented substrate surface.

4. A surface acoustic wave device as claimed in claim 2 wherein said zinc oxide layer has a thickness $h_1$ which satisfies the relation $0 < \omega h_1 \leq 15500.0$, wherein $\omega$ is the angular frequency of the acoustic wave.

5. A surface acoustic wave device as claimed in claim 2 wherein said aluminum nitride layer has a thickness $h_2$ which satisfies the relation $0 < \omega h_2 \leq 15500.0$, wherein $\omega$ is the angular frequency of said surface acoustic wave.

6. A surface acoustic wave device as claimed in claim 2 wherein a conductive layer is provided on at least one of said silicon substrate, said aluminum nitride layer and said zinc oxide layer.

7. A surface acoustic wave device as claimed in claim 1 wherein a conductive layer is provided on at least one of said silicon substrate, said aluminum nitride layer and said zinc oxide layer.

8. A surface acoustic wave device which comprises:
a silicon substrate having a major surface;
an aluminum nitride layer provided on said major surface of said silicon substrate;
a zinc oxide layer provided on said aluminum nitride layer; and
electrodes provided on said aluminum nitride layer;
wherein said major surface of said silicon substrate has substantially (100)-, (110)-, (111)- or (112)-crystalline orientation.

9. A surface acoustic wave device as claimed in claim 8 wherein a surface acoustic wave is propagated substantially in the [001]- or [011]-axis direction on said (100)-oriented substrate surface, in the [001]- or [110]-axis direction on said (110)-oriented substrate surface, in the [112]-axis direction on said (111)-oriented substrate surface, and in the [111]-axis direction on said (112)-oriented substrate surface.

10. A surface acoustic wave device as claimed in claim 8 wherein said zinc oxide layer has a thickness $h_1$ which satisfies the relation $0 < \omega h_1 \leq 15500.0$, wherein $\omega$ is the angular frequency of the acoustic wave.

11. A surface acoustic wave device as claimed in claim 8 wherein said aluminum nitride layer has a thickness $h_2$ which satisfies the relation $0 < \omega h_2 \leq 15500.0$, wherein $\omega$ is the angular frequency of the surface acoustic wave.

12. A surface acoustic wave device as claimed in claim 8 wherein a conductive layer is provided on at least one of said silicon substrate, said aluminum nitride layer and said zinc oxide layer.

13. A surface acoustic wave device as claimed in claim 1 wherein said zinc oxide layer has a thickness $h_1$ which satisfies the relation $0 < \omega h_1 \leq 15500.0$, wherein $\omega$ is the angular frequency of the acoustic wave.

14. A surface acoustic wave device as claimed in claim 1 wherein said aluminum nitride layer has a thickness $h_2$ which satisfies the relation $0 < \omega h_2 \leq 15500.0$, wherein $\omega$ is the angular frequency of the surface acoustic wave.

15. A surface acoustic wave device as claimed in claim 1 wherein a surface acoustic wave is propagated substantially in the [001]- or [011]-axis direction on said (100)-orientated substrate surface, in the [001]- or [110]-axis direction on said (110)-oriented substrate surface, in the [112]-axis direction on said (111)-oriented substrate surface, and in the [111]-axis direction on said (112)-oriented substrate surface.

* * * * *